United States Patent
Whitener et al.

(10) Patent No.: US 9,895,870 B2
(45) Date of Patent: Feb. 20, 2018

(54) GRAPHENE SURFACE FUNCTIONALITY TRANSFER

(71) Applicant: The United States of America, as represented by the Secretary of the Navy, Washington, DC (US)

(72) Inventors: Keith E. Whitener, Alexandria, VA (US); Woo K. Lee, Washington, DC (US); Jeremy T. Robinson, Washington, DC (US); Nabil D. Bassim, Hamilton (CA); Rhonda Michele Stroud, Washington, DC (US); Paul E. Sheehan, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/438,957

(22) Filed: Feb. 22, 2017

(65) Prior Publication Data

US 2017/0259554 A1 Sep. 14, 2017

Related U.S. Application Data

(60) Provisional application No. 62/307,236, filed on Mar. 11, 2016.

(51) Int. Cl.
| | |
|---|---|
| *B32B 38/10* | (2006.01) |
| *B32B 43/00* | (2006.01) |
| *B32B 37/06* | (2006.01) |
| *C01B 31/04* | (2006.01) |
| *B82Y 40/00* | (2011.01) |
| *B82Y 30/00* | (2011.01) |

(52) U.S. Cl.
CPC ............ *B32B 43/006* (2013.01); *B32B 37/06* (2013.01); *B32B 38/10* (2013.01); *C01B 31/0484* (2013.01); *B82Y 30/00* (2013.01); *B82Y 40/00* (2013.01); *Y10S 977/734* (2013.01); *Y10S 977/891* (2013.01); *Y10S 977/895* (2013.01); *Y10T 156/11* (2015.01); *Y10T 156/19* (2015.01)

(58) Field of Classification Search
CPC ..... B32B 38/10; B32B 43/006; Y10T 156/11; Y10T 156/19; C01B 31/0484
USPC .................................................. 156/701, 750
See application file for complete search history.

(56) References Cited

U.S. PATENT DOCUMENTS

| | | | |
|---|---|---|---|
| 2012/0244358 A1 | 9/2012 | Lock | |
| 2013/0015409 A1* | 1/2013 | Fugetsu | B82Y 30/00 252/500 |

(Continued)

OTHER PUBLICATIONS

Whitener Jr, Keith E., et al. "Transfer of Chemically Modified Graphene with Retention of Functionality for Surface Engineering." Nano letters 16.2 (2016): 1455-1461.

(Continued)

*Primary Examiner* — Mark A Osele
*Assistant Examiner* — Nickolas Harm
(74) *Attorney, Agent, or Firm* — US Naval Research Laboratory; Stephen T. Hunnius

(57) ABSTRACT

A method of transferring functionalized graphene comprising the steps of providing graphene on a first substrate, functionalizing the graphene and forming functionalized graphene on the first substrate, delaminating the functionalized graphene from the first substrate, and applying the functionalized graphene to a second substrate.

9 Claims, 3 Drawing Sheets

(56) References Cited

U.S. PATENT DOCUMENTS

2014/0001152 A1 6/2014 Zurutuza Elorza
2014/0238873 A1* 8/2014 Li .............................. C25F 5/00
 205/644
2014/0284303 A1 9/2014 Kim

OTHER PUBLICATIONS

Banszerus, Luca, et al. "Ultrahigh-mobility graphene devices from chemical vapor deposition on reusable copper." Science advances 1.6 (2015): e1500222.
Wang, Di-Yan, et al. "Clean-Lifting Transfer of Large-area Residual-Free Graphene Films." Advanced Materials 25.32 (2013): 4521-4526.
Fechine, Guilhermino JM, et al. "Direct dry transfer of chemical vapor deposition graphene to polymeric substrates." Carbon 83 (2015): 224-231.
Suk, Ji Won, et al. "Transfer of CVD-grown monolayer graphene onto arbitrary substrates." ACS nano 5.9 (2011): 5916-6924.
Wang, Yu, et al. "Electrochemical delamination of CVD-grown graphene film: toward the recyclable use of copper catalyst." ACS nano 5.12 (2011): 9927-9933.
Lock, Evgeniya H., et al. "High-quality uniform dry transfer of graphene to polymers." Nano letters 12.1 (2011): 102-107.

\* cited by examiner

GRAPHENE SURFACE FUNCTIONALITY TRANSFER

This application claims priority to and the benefits of U.S. patent application Ser. No. 62/307,236 filed on Mar. 11, 2016, the entirety of which is herein incorporated by reference.

BACKGROUND

Disclosed herein is a polymer- and etchant-free method of transferring functionalized graphene with a high degree of functional group retention. Specifically, graphene can be reductively functionalized—for example, with hydrogen—on one substrate, such as copper or silicon oxide, and delaminated from this substrate in a mixture of ethanol and water, without the use of chemical etchants. The functionalized graphene can then be reapplied to an arbitrary target substrate without use of a polymer support, and with substantial retention of functional groups. If the target substrate can withstand temperatures higher than 300° C. in a hydrogen atmosphere, the functional groups can be removed to give pristine graphene transferred without metal ion or polymer contamination. This transfer and dehydrogenation procedure can be used to create robust low-background graphene supports for use in transmission electron microscopy (TEM).

Graphene has many interesting electronic properties, but the typical method for growing graphene films is a chemical vapor deposition process on copper or nickel. The electronic properties of these highly conductive metals interfere with those of graphene. Therefore, it is generally necessary to transfer graphene from its metallic growth substrate to another substrate to take advantage of graphene's properties.

Typically, this is achieved by first coating the graphene on the growth metal with a polymer, removing the metal with a chemical etchant, transferring the graphene/polymer stack, and then removing the polymer with a suitable solvent.

The prior art transfer process leaves behind metal ion and polymer contaminants that are very difficult to remove. These impurities adversely affect many of the properties that are key to the development of graphene-specific applications. Properties affected include: electrical conductivity and charge carrier doping, surface wettability, and surface van der Waals forces. Extensive cleaning procedures have been developed to ameliorate these problems, but recent research shows that, in many cases, the contamination imparted by metal ions and polymer residue might be insurmountable. The best course of action would be to avoid these contaminants altogether.

In addition, chemical and biological sensors often operate on principles that require precise control over surface properties with minimal increase in thickness. In this case, functionalizing graphene could be a powerful strategy to independently control the properties of a substrate and its surface while adding a film only a few atoms thick.

The ideal situation would be the capability to functionalize graphene and transfer it onto an arbitrary substrate to match desired surface and substrate properties for the application at hand. However, current transfer methods of chemically functionalized graphene are typically accompanied by significant or total loss of functionality. Furthermore, some functionalization reactions on graphene are incompatible with certain substrates; in these cases, graphene must be functionalized on one substrate and then transferred to another substrate.

Thus, a transfer technique which allows retention of previously introduced chemical functionality would be an essential tool in precise surface engineering.

Here, both goals are achieved—transferring graphene without polymer or etchant, and transferring chemically modified graphene with retention of functionality—with the transfer technique described herein.

BRIEF SUMMARY OF THE INVENTION

Disclosed herein is a polymer-free and etchant-free method of transferring functionalized graphene with a high degree of functional group retention. Specifically, graphene can be reductively functionalized—for example, with hydrogen—on one substrate, such as copper or silicon oxide, and delaminated from this substrate in a mixture of ethanol and water, without the use of chemical etchants. The functionalized graphene can then be reapplied to an arbitrary target substrate without use of a polymer support, and with substantial retention of functional groups. If the target substrate can withstand temperatures higher than 300° C. in a hydrogen atmosphere, the functional groups can be removed to give pristine graphene transferred without metal ion or polymer contamination. This transfer and dehydrogenation procedure can be used to create robust low-background graphene supports for use in transmission electron microscopy (TEM).

Here, two goals are achieved—transferring graphene without polymer or etchant, and transferring chemically modified graphene with retention of functionality—with the transfer technique described herein.

BRIEF DESCRIPTION OF THE DRAWINGS

FIG. 1 illustrates hydrogen assisted graphene transfer.

FIG. 3 illustrates several views.

DETAILED DESCRIPTION

Figure 1B:
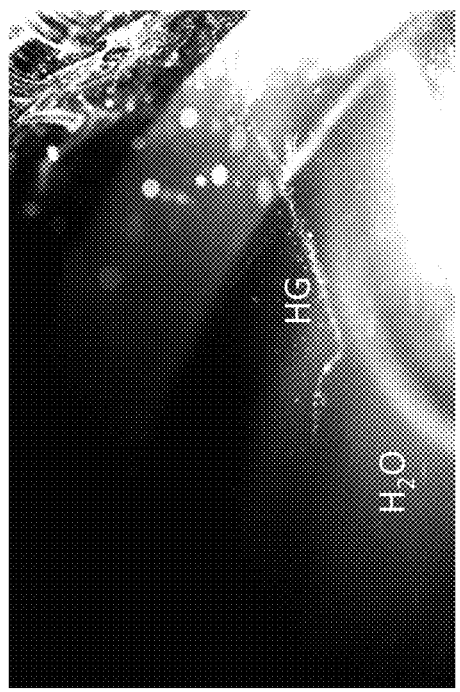
FIG. 1B is a close-up detail of HG on the solvent surface. The HG sheet itself is quite difficult to see, but the edge (black arrow) shows up clearly.
Figure 1C:
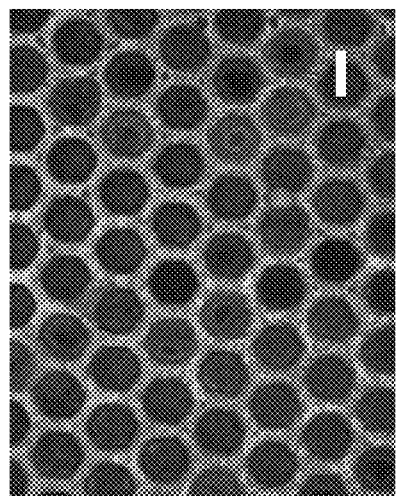
FIG. 1C is an optical micrograph of HG transferred onto a TEM grid (scale bar: 10 µm).

Disclosed herein is a polymer-free and etchant-free method of transferring functionalized graphene with a high degree of functional group retention. Specifically, graphene can be reductively functionalized—for example, with hydrogen—on one substrate, such as copper or silicon oxide, and delaminated from this substrate in a mixture of ethanol and water, without the use of chemical etchants. The functionalized graphene can then be reapplied to an arbitrary target substrate without use of a polymer support, and with substantial retention of functional groups. If the target substrate can withstand temperatures higher than 300° C. in a hydrogen atmosphere, the functional groups can be removed to give pristine graphene transferred without metal ion or polymer contamination. This transfer and dehydrogenation procedure can be used to create robust low-background graphene supports for use in transmission electron microscopy (TEM).

Here, two goals are achieved—transferring graphene without polymer or etchant, and transferring chemically modified graphene with retention of functionality—with the transfer technique described herein.

Demonstrated herein is that Birch-reduced graphene delaminates from its substrate cleanly in an ethanol-water mixture. We have placed the delaminated sheet onto arbitrary substrates and shown that the transfer process does not adversely impact the retention of functional groups. Several functional groups have shown retention, including but not limited to hydrogen, methyl, and diazonium grafted aryl compounds.

Demonstrated herein is that physical properties associated with certain functionalities, such as magnetism in the case of partially hydrogenated graphene (pHG), are retained during transfer.

We have also demonstrated that thermally annealing transferred hydrogenated graphene completely removes hydrogen and restores pristine graphene.

Energy dispersive X-ray spectroscopy (EDX) and scanning transmission electron microscopy (STEM) show that graphene transferred in this manner exhibits neither metal ion impurities associated with use of chemical etching, nor hydrocarbon residue associated with use of polymer support during transfer.

Developed herein is a technology for transferring large areas of graphene polymer-free and etchant-free which are suitable for use as TEM supports.

Example 1

A CVD-grown single layer graphene film on copper was transferred onto $SiO_x$/Si or left on its native copper growth substrate. The sample was placed in a $N_2$-flushed vessel into which 10 mL of anhydrous liquid ammonia was distilled using a dry ice bath.

Approximately 50 mL of lithium wire was added in pieces to the vessel, and the mixture was allowed to react for different durations depending on the desired degree of hydrogenation: 5 to 30 seconds for pHG, and 2 minutes for fully hydrogenated graphene.

The reaction was then quenched with a nucleofuge donor (alcohols such as methanol and ethanol donate protons, alkyl halides such as methyl iodide donate alkyl groups, and other combinations are possible) and the devices were washed with ethanol and dried under a stream of $N_2$.

Figure 1A:
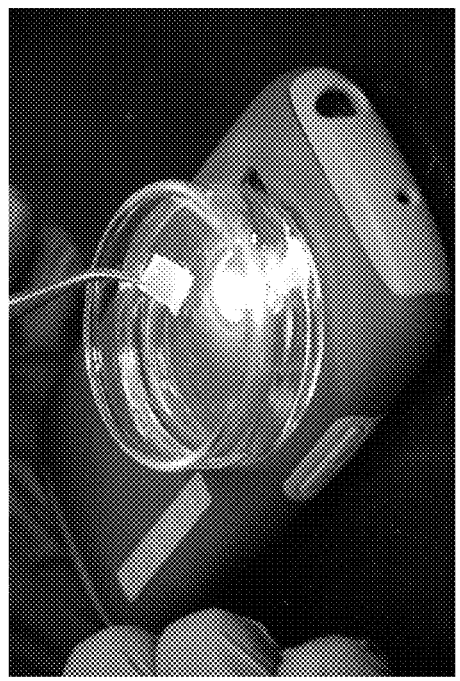
FIG. 1A is an experimental setup: A shallow dish of ethanol/water solution sits atop a bright light source (in this case the flashlight on a cell phone). This image shows transfer of HG, hydrogenated graphene, onto a PVDF wafer.

The sample was then immersed slowly at a shallow angle into a dish containing a 5% v/v solution of ethanol in water. The setup is shown in FIG. 1A. This immersion caused the hydrogenated graphene to delaminate from the substrate and float freely on the water (FIG. 1B). The floating graphene was then picked up with a substrate (examples include: glass, polyvinylidene fluoride, polyethylene, aluminum foil, copper TEM grid).

The film was dried gently under $N_2$ and characterized using Raman spectroscopy, atomic force microscopy (AFM), magnetic force microscopy (MFM), STEM, and optical microscopy.

Example 2

A further experiment involved annealing the newly transferred HG in a tube furnace at 300° C. under a 1:9 v/v mixture of $H_2$/Ar gas.

This step removed the hydrogen from the graphene surface, restoring pristine graphene.

Example 3

In another experiment, graphene was first functionalized with p-nitrobenzene diazonium sulfate, then reduced with lithium in liquid ammonia and delaminated/relaminated as described above.

The properties of this graphene sheet were characterized using Raman spectroscopy, AFM, STEM, conductivity measurements, and energy-dispersive X-ray spectroscopy (EDX).

Example 4

Another experiment involved pre-oxidation of the copper substrate in air before hydrogenation. A sample of graphene on copper was allowed to sit on a hot plate at 250° C. for 10 minutes, and was removed and cooled.

The sample was then hydrogenated and delaminated according to the above procedure. The delamination yielded large area continuous sheets of graphene which could then be redeposited onto TEM grids and annealed to thermally dehydrogenate.

The resulting sample was clean continuous graphene that is suitable for use as a low-background platform for TEM measurements.

Figure 2:
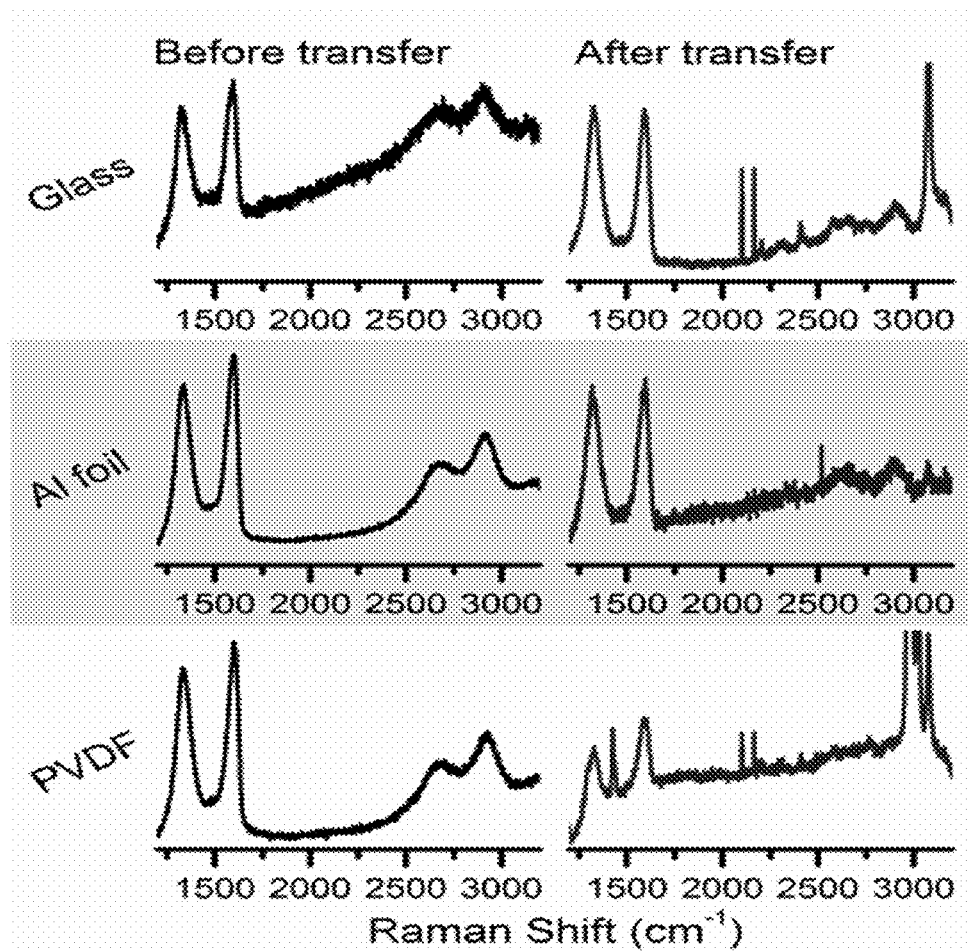
FIG. 2 is a Table of Raman spectra of HG before and after transfer from $Si/SiO_x$ to glass, aluminum foil, and PVDF, polyvinylidene fluoride. Note: the glass peaks present in the PVDF spectrum occur because of the translucency of the polymer and the laser light scattering from the underlying glass wafer support.

Transfer of the CMG onto dissimilar substrate was straightforward. FIG. 2 compares the Raman spectra of HG before and after transfer from Si/$SiO_x$ onto glass, aluminum foil, and polyvinylidene fluoride (PVDF).

Notably, this transfer technique can yield functionalized graphene on substrates such as PVDF that are incompatible with the Birch reduction conditions.

All the Raman spectra indicate that the graphene retains a high degree of functionalization after transfer, regardless of whether the target substrate is dielectric, polymeric, or metallic in nature. The prominent D peaks, overall peak broadening, and significant decrease in the intensity of overtone and combination bands, are all qualitative signs of extensive defect density (i.e., chemical functionalization) in the transferred graphene.

One convenient quantitative measure of defect density is the ratio of the areal intensity of the Raman D peak at 1345 $cm^{-1}$ to that of the G peak at 1585 $cm^{-1}$, commonly called the D/G ratio. For the transfer of hydrogenated graphene, HG, from Si/$SiO_x$ to glass, the D/G ratio is 1.42 before the transfer and 1.38 after the transfer. For the transfer of HG from Si/$SiO_x$ to Al foil, the D/G ratio is 1.27 before the transfer and 1.54 afterward. For the transfer to PVDF (polyvinylidene fluoride), the D/G ratio is 1.32 before the transfer and 1.12 afterward.

While the discussion of the Birch reduction up to now has focused on a hydrogenated product, in principle the reaction can attach any sufficiently stable electrophilic functionality to graphene. In particular, terminating the Birch reduction with alkyl halides yields graphene with pendant alkyl groups. This gives some degree of flexibility in the choice of graphene functionality that can be transferred to an arbitrary substrate.

Example 5

To demonstrate this flexibility, we prepared methyl graphene by quenching the Birch reduction with methyl iodide and examined the Raman spectra before and after transfer. As with hydrogenation, the spectra show little qualitative change, and the D/G ratio change from 1.52 to 1.47 is negligible, thus indicating the retention of the defects throughout the transfer process. In addition, pHG, which has been shown to exhibit ferromagnetism, can be transferred from one substrate to another with retention of its magnetic properties, as shown by MFM.

Figure 3A:
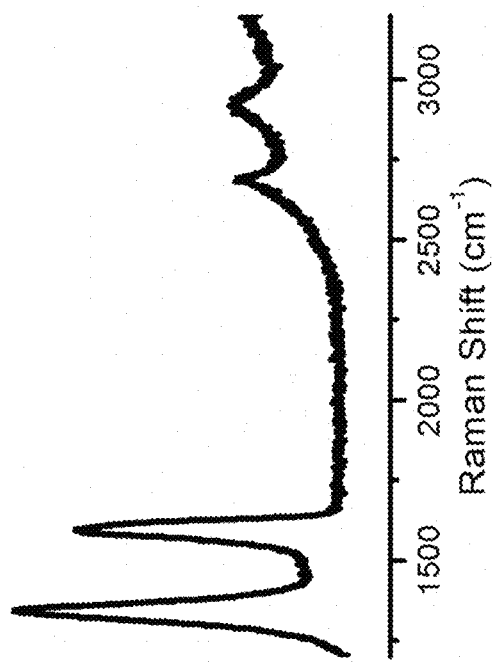
FIG. 3A is Raman spectrum of transferred hydrogenated graphene, HG, before thermal annealing.
Figure 3B:
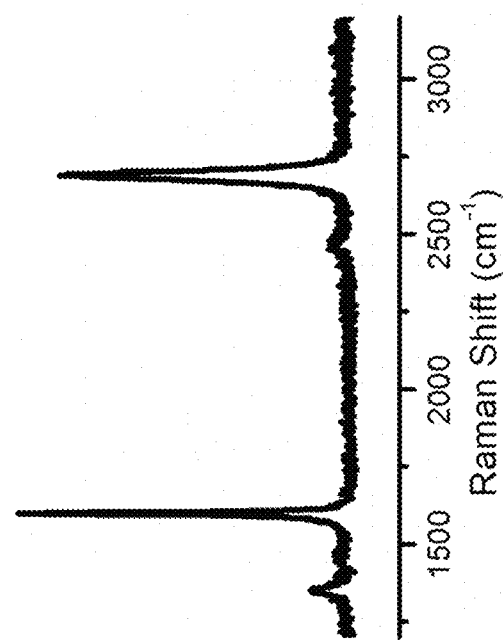
FIG. 3B is Raman spectrum of transferred graphene after annealing.
Figure 3C:
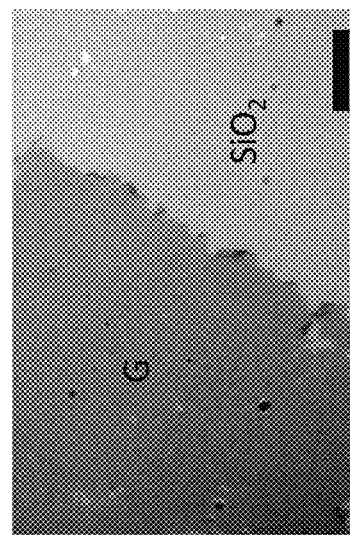
FIG. 3C is an optical micrograph of annealed transferred graphene on $SiO_2$ (scale bar: 10 µm).
Figure 3D:
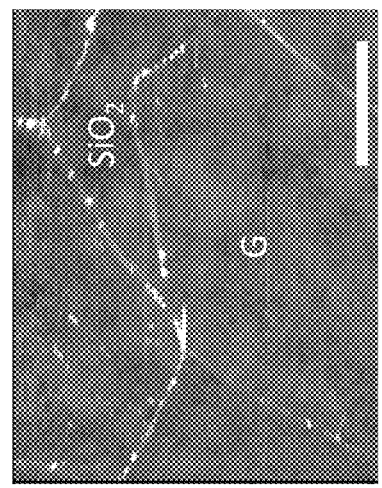
FIG. 3D illustrates an AFM, atomic force microscopy, height image of annealed transferred graphene on $SiO_2$ (scale bar: 1 µm).

A significant advantage of hydrogenated graphene over other common CMGs such as fluorinated graphene or graphene oxide, is that the hydrogen may be removed cleanly by thermal annealing to restore essentially pristine graphene. This thermal reversibility of hydrogenation of graphene suggests a method to transfer graphene without using a support polymer such as PMMA that is a common source of contamination. To this end, we hydrogenated graphene on its copper growth substrate and transferred it onto a $Si/SiO_x$ wafer as described above. We then thermally annealed the wafer at 300° C. under an $H_2/Ar$ atmosphere for 4 hours. The Raman spectra of the transferred material before and after thermal annealing are shown in FIGS. 3A and 3B. The D/G ratio before annealing was 1.43 and after annealing was 0.22, confirming that the material was almost completely restored to pristine graphene. An optical image of the annealed graphene is shown in FIG. 3C and an AFM image is given in FIG. 3D. Both show that the graphene surface is extremely clean, with none of the polymer that appears after standard transfer using polymer supports.

We have demonstrated the transfer of functionalized graphene to and from arbitrary substrates with retention of functional groups. The ability to transfer functionalized graphene is quite important, in light of the recent interest in generating van der Waals heterostructures for precise atomistic control over surface and materials properties. We have demonstrated a method for transferring ultraclean graphene from its growth substrate without the use of chemical etchants or polymer support.

The method presented herein present multiple advantages and benefits. For example, this method eliminates the need for a polymer support for the single-atom thick graphene layer, a significant source of contamination. Further, it eliminates the use of chemical etchant to remove the underlying substrate on which the graphene rests, a significant source of contamination. This new method allows for ultraclean graphene transfer. This ultraclean graphene is ideal as a support for TEM measurements. This method enables easy production of such supports.

Still furthermore, this new method retains the chemical functionalities introduced before or during the Birch reaction upon delamination and relamination onto an arbitrary substrate and retains physical functionalities such as ferromagnetism introduced during the Birch reaction upon delamination and relamination onto an arbitrary substrate.

This new method allows for the transfer of the surface functionality on graphene onto an arbitrary substrate without the often intractable contamination due to etchants and polymer supports.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A method of transferring functionalized graphene, comprising the steps of:
    providing graphene on a first substrate;
    functionalizing the graphene and forming functionalized graphene on the first substrate;
    wherein the step of functionalizing the graphene comprises hydrogenation of the graphene;
    delaminating the functionalized graphene from the first substrate; and
    applying the functionalized graphene to a second substrate.

2. The method of transferring functionalized graphene of claim 1 wherein the first substrate comprises copper or silicon oxide.

3. The method of transferring functionalized graphene of claim 1 wherein the step of delaminating the functionalized graphene from the first substrate comprises immersing in water.

4. The method of transferring functionalized graphene of claim 1 wherein no polymer or etchant is utilized during the providing, functionalizing, delaminating, or applying steps.

5. The method of transferring functionalized graphene of claim 1 further including the step of annealing.

6. The method of transferring functionalized graphene of claim 5 wherein the step of annealing comprises heating the functionalized graphene on the second substrate to a temperature higher than 300° C. in a hydrogen atmosphere.

7. The method of transferring functionalized graphene of claim 6 wherein the functionalized graphene is pristine graphene without metal ion or polymer contamination.

8. The method of transferring functionalized graphene of claim 1 wherein the step of functionalizing the graphene comprises functionalizing with a molecule selected from the methyl or aryl group.

9. The method of transferring functionalized graphene of claim 1 wherein the step of delaminating the functionalized graphene from the first substrate comprises immersing in a mixture of ethanol and water.

* * * * *